United States Patent
Xie et al.

(10) Patent No.: US 7,854,057 B2
(45) Date of Patent: Dec. 21, 2010

(54) METHOD OF FACILITATING SUPERCONDUCTING TAPE MANUFACTURING

(75) Inventors: Yi-Yuan Xie, Guilderland, NY (US); Venkat Selvamanickam, Wynantskill, NY (US); Jason Madison Duval, Athens, NY (US)

(73) Assignee: SuperPower Inc., Schenectady, NY (US)

( * ) Notice: Subject to any disclaimer, the term of this patent is extended or adjusted under 35 U.S.C. 154(b) by 345 days.

(21) Appl. No.: 11/319,972

(22) Filed: Dec. 28, 2005

(65) Prior Publication Data
US 2007/0149411 A1 Jun. 28, 2007

(51) Int. Cl.
*H01B 12/00* (2006.01)
*H01B 13/00* (2006.01)
(52) U.S. Cl. .................. 29/599; 505/310; 505/726
(58) Field of Classification Search .......... 29/599; 505/310, 726; 174/125.1
See application file for complete search history.

(56) References Cited

U.S. PATENT DOCUMENTS

| | | | |
|---|---|---|---|
| 5,521,148 A | * | 5/1996 | Torii et al. ............... 505/120 |
| 6,034,527 A | | 3/2000 | Schiller et al. |
| 6,452,375 B1 | * | 9/2002 | Coulter et al. ............ 324/76.11 |
| 2005/0014653 A1 | * | 1/2005 | Reeves et al. .............. 505/100 |
| 2005/0220986 A1 | | 10/2005 | Selvamanickam et al. |
| 2005/0239659 A1 | | 10/2005 | Xiong et al. |
| 2005/0256011 A1 | * | 11/2005 | Ignatiev et al. ............ 505/473 |

OTHER PUBLICATIONS

Microcoating Technologies, Inc., "On-line Texture Diagnostics for Coated Conductor Manufacture," Project Summary, Final Report for U.S. DOE SBIR Phase I Contract No. DE-FG02-OIER83208, Dec. 30, 2002, http://www.google.com/search?q=cache:zhBTkPtH91cJ:www.osti.gov/bridge/serviets/puri/824132ekOjkc/native/+%22superconducting+tape%22+measurements+record+data&hl=en&ct=cink&cd=33& downloaded on Jan. 1, 2008.

* cited by examiner

*Primary Examiner*—A. Dexter Tugbang
*Assistant Examiner*—Livius R Cazan
(74) *Attorney, Agent, or Firm*—Larson Newman & Abel, LLP (57) ABSTRACT

A method of facilitating superconducting tape manufacturing is provided that includes forming a long-length superconducting tape having a layered structure, comprising a substrate having a dimension ratio not less than about 100, a buffer layer overlying the substrate, and a high temperature superconducting layer overlying the buffer layer. The method further includes characterizing the superconducting tape to create a data set having a plurality of values that are a function of length of the superconducting tape and distributing both the superconducting tape and the data set.

20 Claims, 5 Drawing Sheets

METHOD OF FACILITATING SUPERCONDUCTING TAPE MANUFACTURING

BACKGROUND

1. Field of the Disclosure

This disclosure relates in general to superconducting tapes and particularly to methods of facilitating superconducting tape manufacturing.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductive layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, methods of forming commercially viable superconductive tapes and power components utilizing such superconductive tapes.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
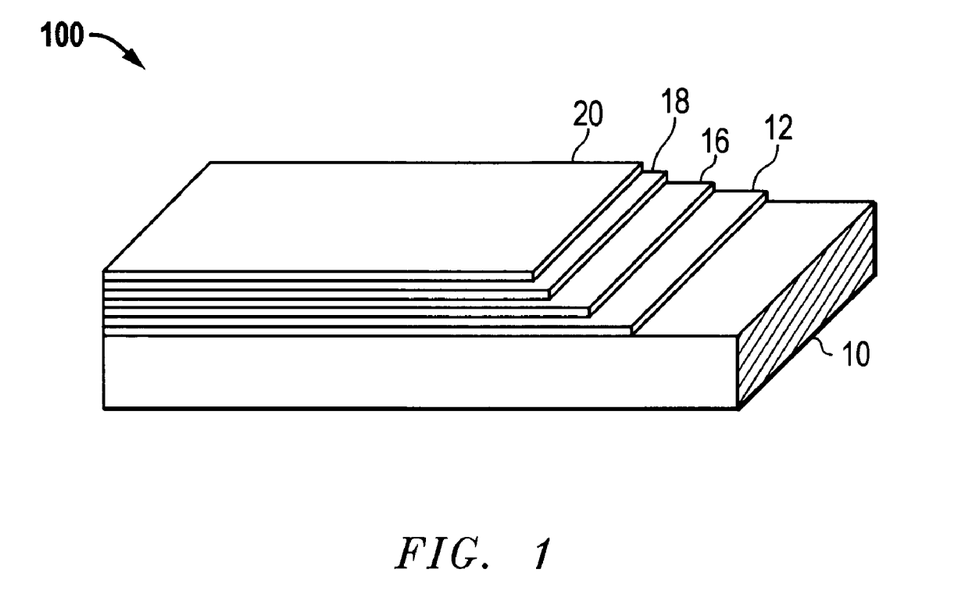
FIG. 1 illustrates a perspective view showing the generalized structure of a superconducting article in accordance with an embodiment of the present disclosure.

Turning to FIG. 1, a general layered structure of a superconducting article is depicted for illustrative purposes. The superconducting article includes a substrate 10, a buffer layer 12 overlying the substrate 10, and a superconducting layer 16. Optionally, the superconducting article can also include a capping layer 18 over the superconducting layer, which typically includes a noble metal layer. The superconducting article can optionally include a stabilizer layer 20, which typically includes a non-noble metal.

According to one embodiment, the formation of a superconducting article includes providing a substrate 10. The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

According to one embodiment, the substrate 10 is in a tape-like configuration, having a high dimension ratio. For example, the width of the tape is generally on the order of about 0.4-10 cm, and the length of the tape is typically at least about 100 m, most typically greater than about 500 m. Embodiments provide for superconducting tapes that include a substrate 10 having a length on the order of 1 km or above. Accordingly, the substrate can have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

Furthermore, the substrate can be treated so as to have desirable surface properties for subsequent deposition of the constituent layers of the superconductor tape. For example, the surface may be lightly polished to a desired flatness and surface roughness, after which the surface is also typically cleaned followed by annealing and ion-treatment. Such techniques are described more fully in U.S. Ser. No. 10/816,045, filed Apr. 1, 2004 incorporated herein by reference.

Additionally, the substrate may be biaxially textured as is understood in the art, such as by the known RABiTS (roll assisted biaxially textured substrate) technique. Furthermore, an optional protective layer (not illustrated) can be formed over the substrate, typically comprising an oxide material for ease of deposition of a buffer layer 12.

Turning to the buffer layer 12, the buffer layer may be a single layer, or more commonly, be made up of several films. Most typically, the buffer layer includes at least one biaxially textured film, having a crystalline texture that is generally aligned along crystal axes both in-plane and out-of-plane of the film. As is understood in the art, biaxial texturing may be accomplished by IBAD. IBAD is an acronym that stands for ion beam assisted deposition, a technique that may be advantageously utilized to form a suitably textured buffer film for subsequent formation of an superconductor layer having desirable crystallographic orientation for superior superconducting properties. Generally, the biaxially textured IBAD film has a rock-salt like crystal structure, as defined and described in U.S. Pat. No. 6,190,752, incorporated herein by reference, and further described below in accordance with the embodiments.

The superconducting layer 16 is generally in the form of a high-temperature superconducting (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconducting layer 16 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconducting layer 16 has a thickness on the order of about 1 to about 30 microns, most typically about 2 to about 20 microns, such as about 2 to about 10 microns, in order to get desirable amperage ratings associated with the superconductor layer 14.

The capping layer 18 and the stabilizer layer 20 are generally implemented to provide a low resistance interface and for electrical stabilization to aid in prevention of superconductor burnout in practical use. More particularly, layers 18 and 20 aid in continued flow of electrical charges along the superconductor in cases where cooling fails or the critical current density is exceeded, and the superconductor layer moves from the superconducting state and becomes resistive. Typically, a noble metal is utilized for capping layer 18 to prevent unwanted interaction between the stabilizer layer(s) and the superconductor layer 16. Typical noble metals include gold, silver, platinum, and palladium. Silver is typically used due to its cost and general accessibility. The capping layer 18 is typically made to be thick enough to prevent unwanted diffusion of the components from the stabilizer layer 20 into the superconductor layer 16, but is made to be generally thin for cost reasons (raw material and processing costs). Typical thicknesses of the capping layer 18 range within about 0.1 to about 10.0 microns, such as 0.5 to about 5.0 microns. Various techniques may be used for deposition of the capping layer 18, including physical vapor deposition, such as DC magnetron sputtering.

The stabilizer layer 20 is generally incorporated to overlie the superconducting layer 16, and in particular, overlie and directly contact the capping layer 18 in the particular embodiment shown in FIG. 1. The stabilizer layer 20 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon According to one aspect, a method of facilitating superconducting tape manufacturing is provided. The method includes forming a long-length superconducting tape having a layered structure including, a substrate having a dimension ratio not less than about 100, a buffer layer overlying the substrate, and a high temperature superconducting layer overlying the buffer layer. The method also includes characterizing the superconducting tape to create a data set, the data set including a plurality of values that are a function of length of the superconducting tape and distributing the superconducting tape and the data set.

In general, characterizing the superconducting tape can include a variety of functions, such as measuring certain characteristics of the tape to create a data set. Characterizing also includes measuring the characteristics of the superconducting tape using a variety of methods, at a variety of locations, and at a variety of times. For the purposes of this disclosure, reference to "the tape" or "superconducting tape" refers to the tape in any one of a variety of stages, such as the entire finished tape including all constituent layers, or an unfinished tape including a plurality of the constituent layers, or an individual constituent layer of the tape, such as the substrate. Accordingly, discussions referring to characterizing the superconducting tape include characterizing the entire tape, one constituent layer, or a plurality of constituent layers of the tape. Use of characterizing techniques as disclosed herein in the context of partially finished tapes is particularly suitable for on-line control/monitoring for various manufacturing processes utilized to complete the tape.

In reference to methods of characterizing, according to one embodiment, characterizing may include measuring the electrical characteristics of the tape, such as the critical current of the tape as a function of angular orientation of magnetic field, hereinafter, the angular dependence of critical current. Measuring electrical characteristics of the superconducting tape facilitates the ability to monitor defects within the product and production of a product of known and quantifiable specifications. According to one embodiment, each of the measured values may be associated with a corresponding position along the length of the superconducting tape, which facilitates profiling the tape as discussed later. Measuring electrical characteristics of the tape, such as the angular dependence of the critical current, is carried out after formation of the superconducting layer, oftentimes the tape being in finished form. That is, the angular dependence of the critical current is measured on a tape including at least the substrate, the buffer layer, and the high temperature superconducting layer. In another embodiment, the angular dependence of the critical current is measured on the finish-formed superconducting tape including all constituent layers.

According to one embodiment, characterizing may take place during the forming of the tape with electrical contact made directly with the superconducting layer or using non-contact testing methods such as hall probe and inductive coil scanning techniques. Alternatively, electrical characteristics of the tape may be measured after completion of formation of the tape, such as during a rapid screening process. Such a post-forming process may utilize a similar reel-to-reel process that is utilized for forming the tape.

Figure 2:
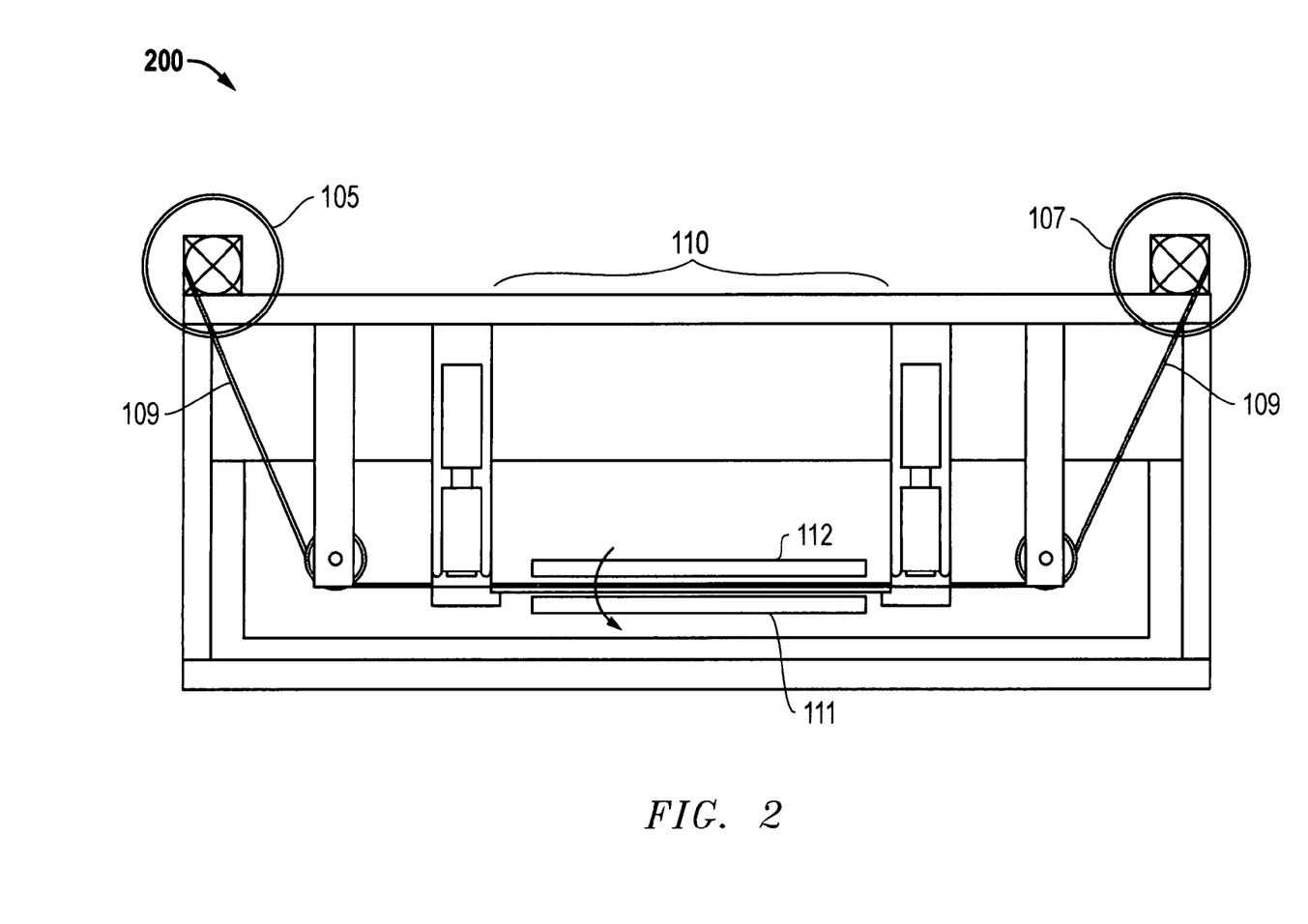
FIG. 2 illustrates a reel-to-reel apparatus for carrying out electrical characterization as a function of location in accordance with an embodiment of the present disclosure.

FIG. 2 illustrates a reel-to-reel apparatus 200 in which the tape 109 is controlled between reels 105 and 107, for measuring the electrical characteristics of the superconducting tape. Here, measuring the electrical characteristics of the tape includes measuring the angular dependence of critical current of the tape 109 as it passes through an electrical characterization zone 110. The electrical characterization zone 110 houses a pair of permanent magnets 111 and 112, capable of inducing a magnetic field in a portion of the tape 109. The electrical characterization zone 110 may contain other such devices capable of inducing an electromagnetic field, such as a dipole electromagnet. The magnets 111 and 112 can be rotated about the longitudinal axis of the tape 109 thus altering the angle of the induced field, thereby enabling measurement of the angular dependence of critical current within the tape 109.

In addition to characterizing the superconducting tape through electrical measurements, characterizing may alternatively (or additionally) include measuring physical properties of the superconducting tape. Measurement of physical properties of the superconducting tape facilitates monitoring defects within the product and provides a product of known and quantifiable specifications. Moreover, the ability to measure certain physical properties, such as the width and the thickness of the tape, assists the calculation of particular electrical characteristics, such as the engineering critical current density (Je).

According to one embodiment, characterizing includes measuring the width of the tape, typically at a plurality of locations along substantially the entire length of the tape. In another embodiment, characterizing includes measuring the thickness of the tape. According to various embodiments, the target physical property, such as width and/or thickness is carried out with respect to one, a plurality of, or all constituent layers in finished or partially finished form. In one embodiment, characterization is carried out with respect to the substrate. In another embodiment, characterization is carried out with respect to the substrate and buffer layer. In yet another embodiment, the substrate, buffer layer and superconducting layer are characterized. In each case, each measurement corresponds to a dedicated position along the length of the superconducting tape.

According to one embodiment, characterization may take place during the forming of the tape. Alternatively, physical properties of the tape may be measured after completion of formation of the tape, such as during a rapid screening process. Such post-forming measurements may utilize a reel-to-reel process.

Figure 3:
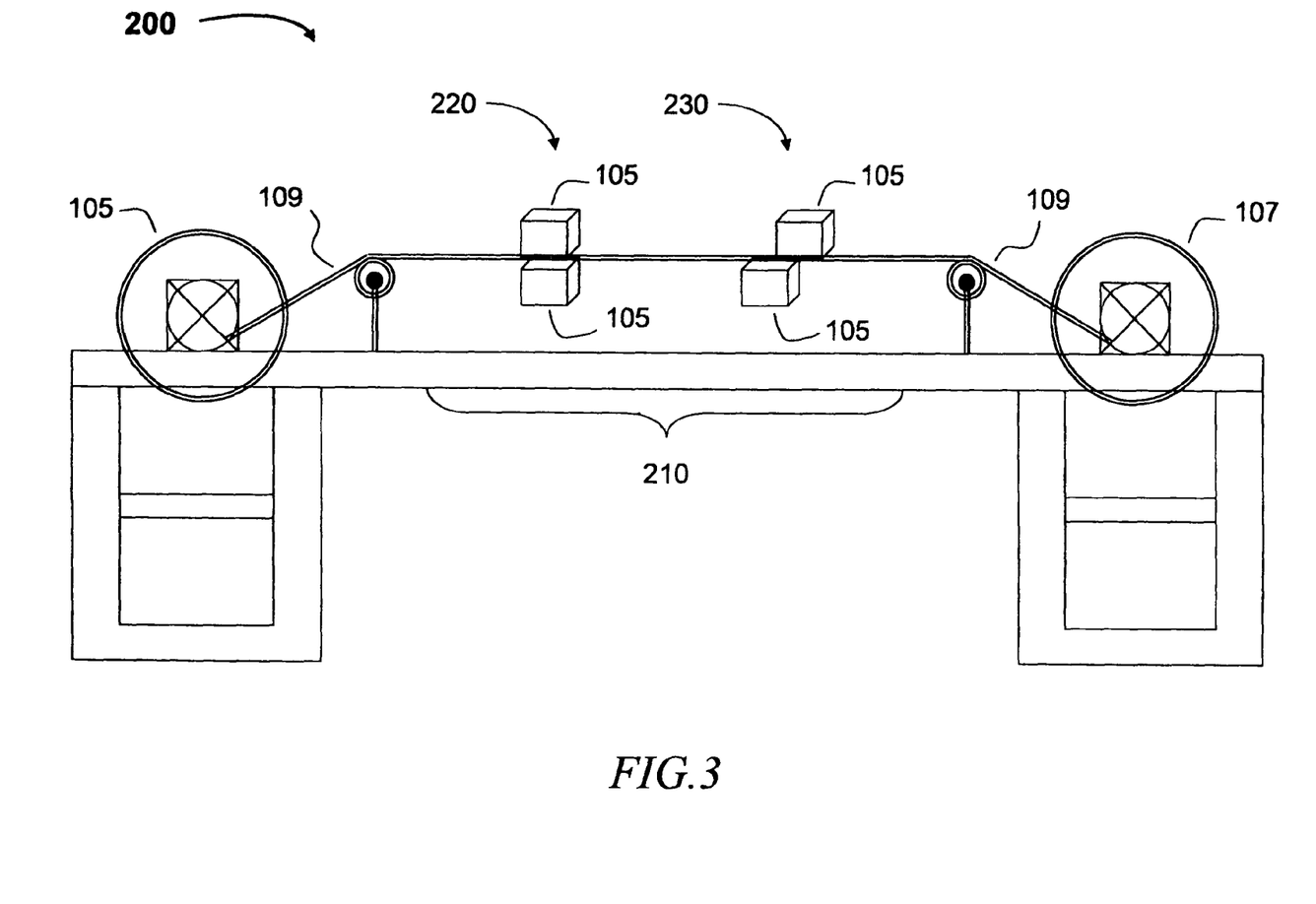
FIG. 3 illustrates a reel-to-reel apparatus for carrying out physical dimension characterization as a function of location in accordance with an embodiment of the present disclosure.

FIG. 3 illustrates a particular embodiment for measuring physical properties of the superconducting tape. FIG. 3 illustrates a reel-to-reel apparatus 200 in which the tape 109 traverses a physical dimension characterization zone 210 between reels 105 and 107. The physical dimension characterization zone 210 includes a width measuring device 220 and a thickness measuring device 230. According to one embodiment, the width measuring device 220 is a laser micrometer including a pair of laser through beams 221 and 222 positioned on either side of the tape, such that the dimension of the tape to be measured (the width) is in a plane substantially perpendicular to the beam of the laser through beams 221 and 222. Other suitable width measuring devices can include inductive probes.

In further reference to FIG. 3, the physical dimension characterization zone 210 also includes a thickness measuring device 230. According to one embodiment, the thickness measuring device 230 is a laser micrometer including a pair of laser through beams 231 and 232. As illustrated, the pair of laser through beams 231 and 232 are positioned on either side of the tape such that the dimension of the tape desired to be measured (the thickness) is substantially perpendicular to the measuring beams of the pair of laser through beams 231 and 232. The thickness measuring device 230 can be embodied as any one of a variety of other devices, such as a laser triangulation sensor, inductive probe, beta ray sensor, gamma ray sensor, or an ultrasonic sensor. It will be appreciated that different devices may require alternative orientation in relation to the tape depending upon the measuring instrumentation used by the device.

Certain devices, such as the beta ray sensor, facilitate measuring the thickness of one constituent layer. Other devices such as the ultrasonic sensors, among other things, can assist in the location of defects, such as air pockets within the constituent layers of the tape. Such devices facilitate accurate and rapid measurements to provide a high data-sampling rate, which is suitable for the rapid processing demands of the superconducting manufacturing process.

Characterizing further includes creation of a data set having a plurality of values. The plurality of values within the data set correspond to the measured characteristics or properties of the tape, and the number of values within each set may vary depending upon the sampling rate (frequency) of the measuring device and length subjected to characterization. According to one embodiment, the data set has a plurality of values not fewer than about 20 values. Other embodiments demonstrate a plurality of values not fewer than about 40 values, or not fewer than about 80 values. Still, other data sets may contain more values, such as not fewer than about 100 values.

As previously mentioned, each of the values in the data set corresponds to a position along the length of the tape. In addition, the length of the superconducting tape that is sampled for measurement may vary. According to one embodiment, the plurality of values within the data set corresponds to a plurality of positions extending along most of the length of the superconducting tape. In another embodiment, the plurality of values are associated with a plurality of positions extending along not less than about 60% of the length of the tape, not less about 75% of the length of the tape, not less than about 85% of the length of the tape, or not less than about 90% of the length of the tape. In some embodiments, the plurality of values are gathered from positions extending along the entire length of the superconducting tape.

Figure 4:
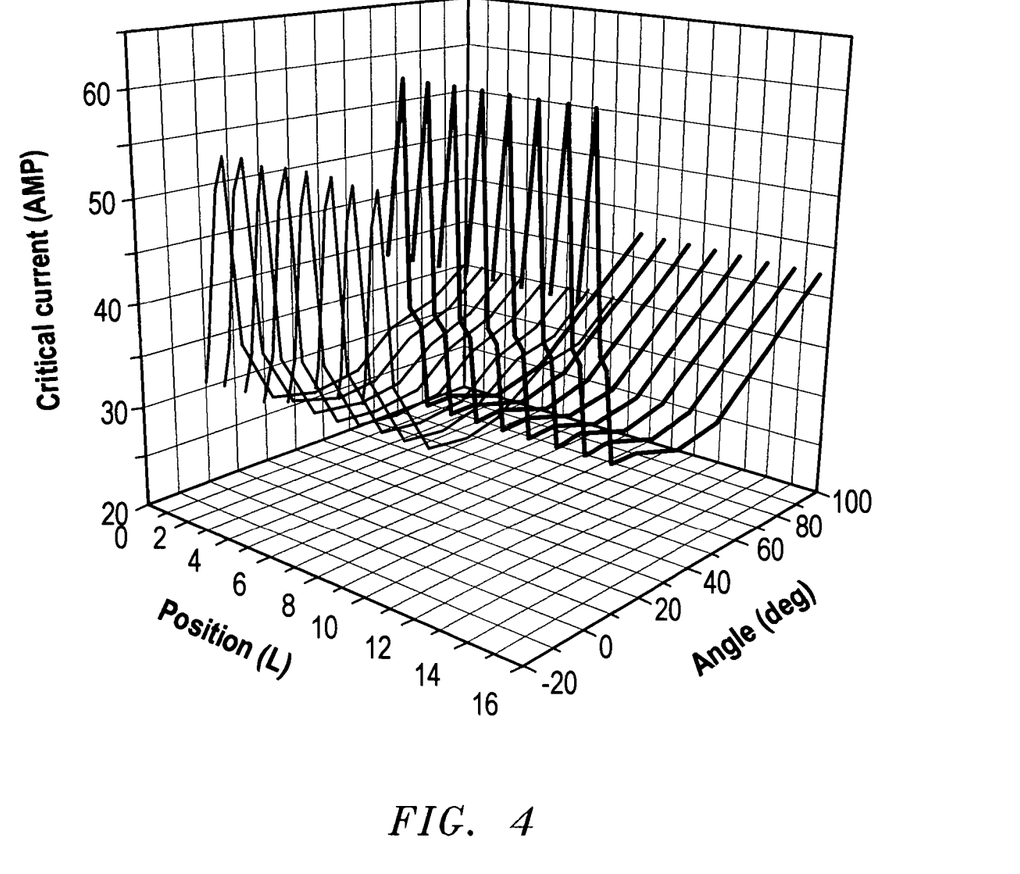
FIG. 4 illustrates a profile of measured critical current as a function of the position along a length of a superconducting tape, and the angle of induce field.

Additionally, the correspondence between the measured values and the position along the length of the tape from which the measurements were taken facilitates the creation of characteristic profiles. According to one embodiment, measurements of the electrical characteristics, such as the angular dependence of critical current, facilitates the formation of an electrical characteristic profile, as illustrated in FIG. 4. The exemplary plot of FIG. 4 illustrates measurements of the critical current as a function of both the position along the tape from which the measurement was taken and the angle at which the induced magnetic field was positioned during the measurement. The ability to quantify the electrical characteristics of the superconducting tape in such a format assists the manufacturer in quantifying the specifications of the product as well as monitoring the production process for defects. Moreover, such electrical characteristic profiles provide a manufacturer with the ability to provide a product of known specifications to a customer.

Figure 5:
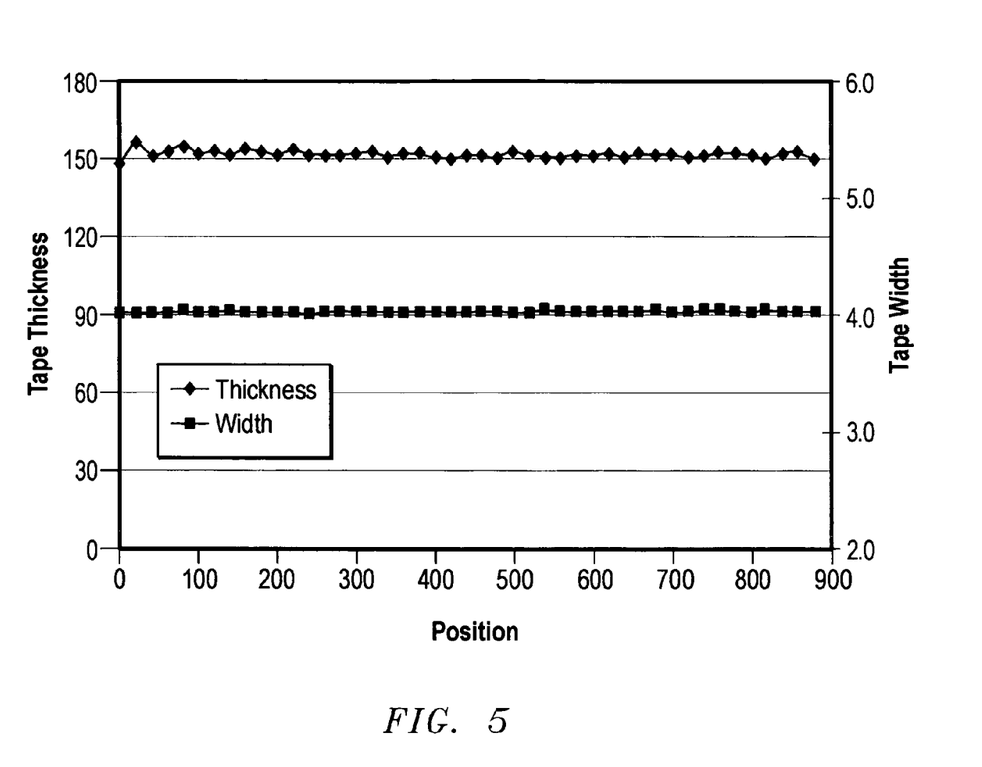
FIG. 5 illustrates a profile of tape thickness and tape width as a function of position along a length of a superconducting tape.

FIG. 5 illustrates a physical dimension profile, including thickness and width as a function of position along the length of a superconducting tape for a segment of the superconducting tape. The ability to profile and quantify the physical dimensions of the superconducting tape assists the manufacturer in quantifying the physical specifications as well as calculations of electrical characteristics of the product. Among other things, creation of a physical dimension profile is a suitable method for monitoring the production process for defects and provides a manufacturer with the ability to provide a product of known specifications to a customer.

In reference to providing a product of known specifications to a customer, after characterization, the superconducting tape is generally packaged for delivery to a customer. According to one embodiment, packaging of the tape includes providing the superconducting tape on a reel to a customer. Additionally, both the superconducting tape and the data set can be provided to a customer together, the data set being provided on a tangible medium. The provision of the data set and associated characteristic profile, ensures a level of quality and performance of a product and facilitates the sale of the product. The data set can be provided in a variety of tangible media such as a paper print or electronic media, such as an optical disc (CD or DVD, for example) or magnetic disk. Moreover, the superconducting article and the accompanying data set can be delivered to the same location and/or same entity for example, both the superconducting tape and the data set may be distributed to the same customer.

While the invention has been illustrated and described in the context of particular embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A method of facilitating superconducting tape manufacturing comprising:
    forming a long-length superconducting tape having a layered structure, comprising: a substrate, wherein the substrate has a dimension ratio not less than about 100; a buffer layer overlying the substrate; and a high temperature superconducting layer overlying the buffer layer;
    translating the long-length superconducting tape between a pair of magnets;
    inducing a magnetic field in a portion of the long-length superconducting tape with the pair of magnets;
    rotating the pair of magnets around a longitudinal axis of the long-length superconducting tape to alter the angle of the magnetic field; and
    measuring a critical current of the portion of the tape at a plurality of angles of the magnetic field.

2. A method of facilitating superconducting tape manufacturing comprising:
    forming a long-length superconducting tape having a layered structure, comprising: a substrate, wherein the substrate has a dimension ratio not less than about 100; a buffer layer overlying the substrate; and a high temperature superconducting layer overlying the buffer layer;
    translating the long-length superconducting tape between a pair of magnets;
    inducing a magnetic field in a portion of the long-length superconducting tape with the pair of magnets;
    rotating the pair of magnets around a longitudinal axis of the long-length superconducting tape to alter the angular orientation of the magnetic field;
    characterizing the superconducting tape to create a data set, the data set including a plurality of values that are a function of length of the superconducting tape, the plurality of values including a plurality of angular dependence of critical current values each corresponding to the dependence of the critical current on an angular orientation of the magnetic field induced in a portion of the superconducting tape, and the characterizing being carried out by measuring the plurality of angular dependence of critical current values at a plurality of respective positions along a length of the superconducting tape; and
    distributing the superconducting tape and the data set to a customer.

3. The method of claim 2, wherein the substrate has a dimension ratio not less than 1000.

4. The method of claim 2, wherein the buffer layer comprises a buffer film having a biaxial crystal texture.

5. The method of claim 2, further comprising packaging the superconducting tape.

6. The method of claim 5, wherein packaging includes providing the superconducting tape on a reel.

7. The method of claim 2, wherein distributing includes distributing the superconducting tape and the data set to the same customer location.

8. The method of claim 2, further comprising providing the data set in a tangible medium.

9. The method of claim 2, wherein the plurality of values comprises a plurality of physical dimension values, wherein characterizing is carried out by measuring the plurality of physical dimension values at a plurality of respective positions along a length of the superconducting tape.

10. The method of claim 9, wherein the plurality of physical dimension values includes a plurality of thickness values.

11. The method of claim 9, wherein the plurality of physical dimension values includes a plurality of width values.

12. The method of claim 9, wherein measuring the plurality of physical dimension values includes measuring using at least one component from the group consisting of a laser device, electromagnetic device, inductive probe, ultrasonic device, gamma ray device, and beta ray device.

13. The method of claim 2, wherein the plurality of values are associated with a plurality of positions extending along most of the length of the superconducting tape.

14. The method of claim 13, wherein the plurality of values extend along not less than about 85% of the length of the superconducting tape.

15. The method of claim 2, wherein the angular orientations include a first angle and a second angle that is different from the first angle.

16. The method of claim 2, wherein the plurality of values comprises not fewer than 20 values.

17. The method of claim 2, wherein characterizing the superconducting tape is carried out, during forming the superconducting tape.

18. The method of claim 17, wherein characterizing the superconducting tape comprises measuring a characteristic of a component layer comprising the superconducting tape.

19. The method of claim 18, wherein measuring the characteristic comprises identifying defects in the superconducting layer of the superconducting tape.

20. The method of claim 19, wherein identifying defects in the superconducting layer further includes determining a location of defects in the superconducting layer along the length of the superconducting tape.

* * * * *